United States Patent [19]
Dingwall

[11] 4,181,862
[45] Jan. 1, 1980

[54] HIGH SPEED RESETTABLE DYNAMIC COUNTER

[75] Inventor: Andrew G. F. Dingwall, Bridgewater, N.J.

[73] Assignee: RCA Corporation, New York, N.Y.

[21] Appl. No.: 832,462

[22] Filed: Sep. 12, 1977

[30] Foreign Application Priority Data

Sep. 27, 1976 [GB] United Kingdom ............... 40027/76

[51] Int. Cl.² .................... H03K 23/08; H03K 21/32; H03K 21/36; H03K 3/353
[52] U.S. Cl. ............................. 307/225 C; 307/200 B; 307/220 C; 307/279; 328/48
[58] Field of Search ........... 307/220 C, 221 C, 223 C, 307/224 C, 225 C, 279, 269, 289, 291, 200 B; 328/99, 48

[56] References Cited

U.S. PATENT DOCUMENTS

| | | | |
|---|---|---|---|
| 3,560,998 | 2/1971 | Walton | 307/225 CX |
| 3,823,551 | 7/1974 | Riehl | 307/225 CX |
| 3,887,822 | 6/1975 | Suzuki | 307/279 |
| 3,930,169 | 12/1975 | Kuhn, Jr. | 307/279 X |
| 3,973,139 | 8/1976 | Dingwall | 307/225 C |
| 4,002,926 | 1/1977 | Moyer | 307/225 C |
| 4,114,049 | 9/1978 | Suzuki | 307/279 X |
| 4,124,807 | 11/1978 | Herber | 307/279 |

FOREIGN PATENT DOCUMENTS

| | | | |
|---|---|---|---|
| 2461935 | 7/1975 | Fed. Rep. of Germany | 307/225 C |
| 1451784 | 10/1976 | United Kingdom | 307/225 C |

*Primary Examiner*—Larry N. Anagnos
*Attorney, Agent, or Firm*—H. Christoffersen; Henry I. Schanzer

[57] ABSTRACT

A counter stage includes a clocked transmission gate which, when turned on, couples the output of the stage back to its input. A resetting circuit is connected to the input of the stage for selectively clamping the input to a fixed voltage level representative of a logic one or a logic zero. The resetting circuit is enabled only when the clocked transmission gate is turned off, whereby no current can flow from, or to, the output via the resetting means. This enables high speed of reset since the input of the stage is then easily discharged (or charged) to the selected fixed level via the resetting circuit.

10 Claims, 7 Drawing Figures

HIGH SPEED RESETTABLE DYNAMIC COUNTER

This invention relates to counter stages which can be set or reset very quickly, and to counters employing such counter stages.

Figure 4A:
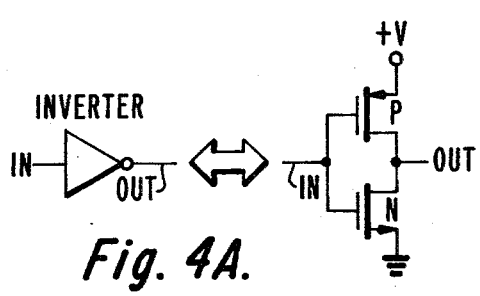
Figure 4B:
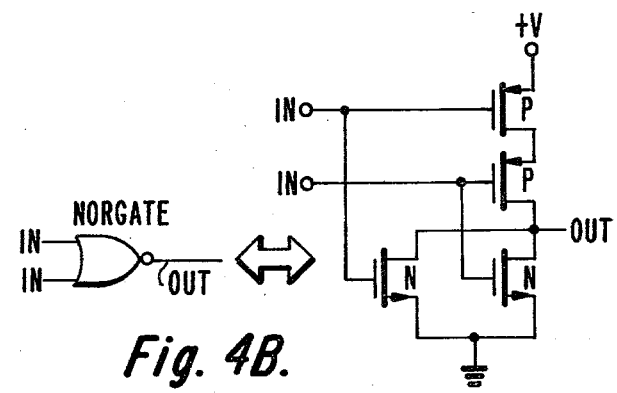
Figure 6:
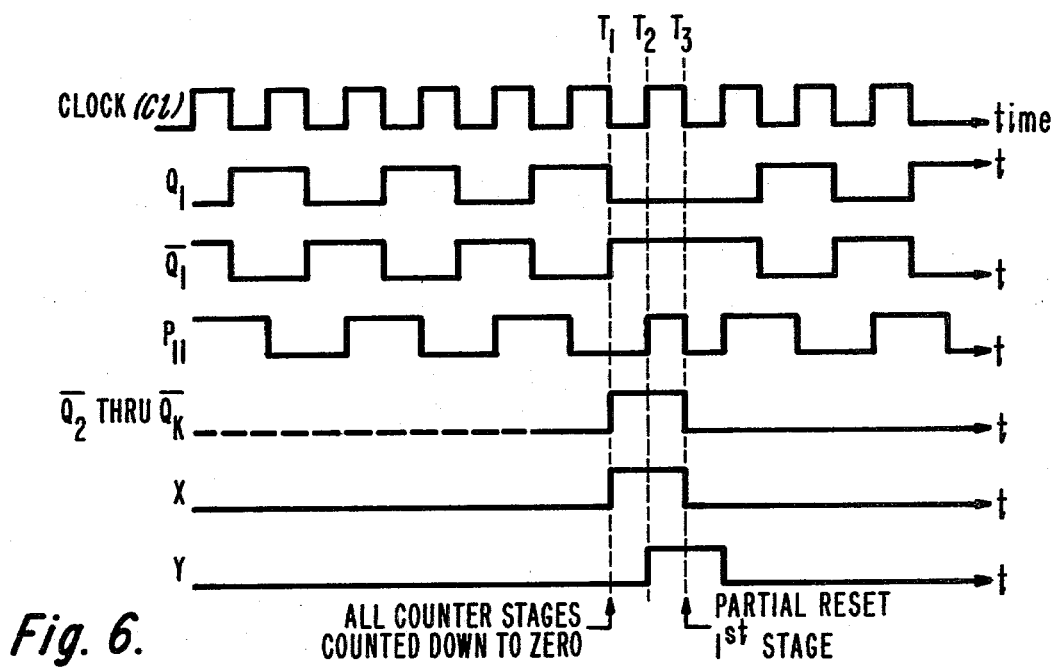
Figure 5:
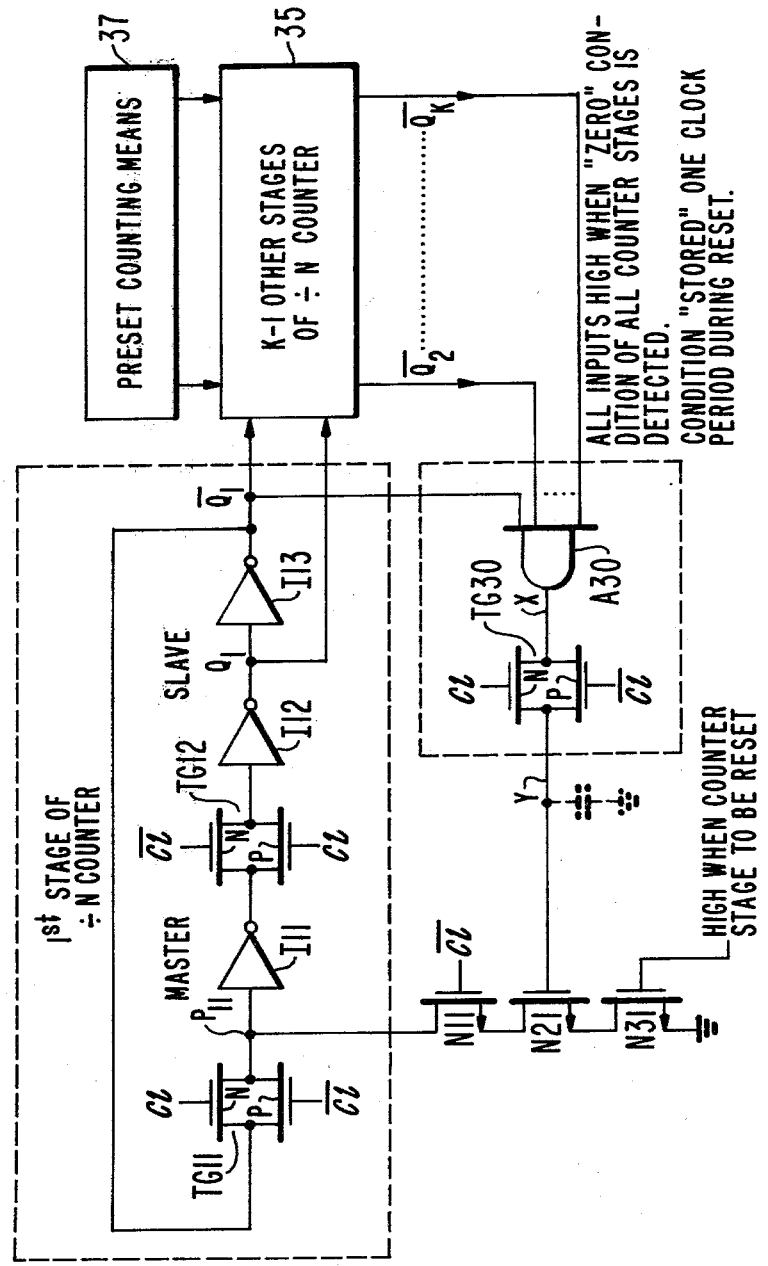

FIGS. 4A and 4B include schematic diagrams of an inverter and a two input NOR gate employing insulated-gate field-effect transistors (IGFETs) of complementary conductivity type;

FIG. 5 is a schematic diagram of a partially resettable binary counter stage and counter arrangement embodying the invention; and FIG. 6 is a diagram of waveforms associated with the circuit of FIG. 5.

A high speed resettable (or settable) counter is a key element in many applications. One of these is frequency synthesis which is an important technique for tuning among others, in citizen's band radio, and TV systems. The "quality" of the synthesized frequency is largely determined by the speed with which the counters can be reset. If the maximum speed of the resettable counter is less than optimum, the comparison frequency (i.e. the frequency at which the circuit is automatically tuned) is also less than optimum, resulting in undesirable effects such as increased jitter, parasitic frequency modulations producing hum in audio signals, slower lock-in time (after changing channels), and increased circuit complexity since additional counter stages are required to generate the lower comparison frequencies.

Figure 1:
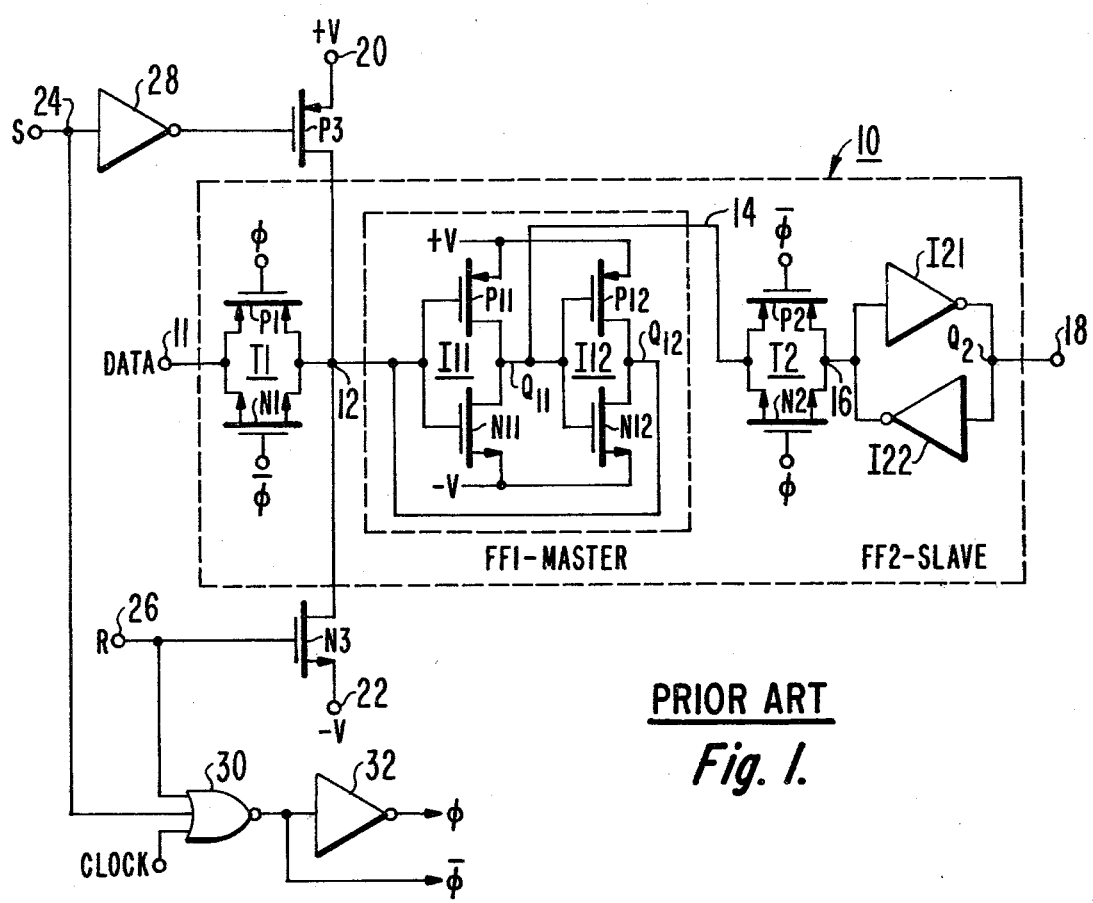
FIG. 1 is a schematic diagram of a prior art static binary counter stage which can be set or reset.

Static counters which can be set and/or reset are known. One example is illustrated in FIG. 1 which is a copy of FIG. 1 of U.S. Pat. No. 3,812,384 issued to Gordon F. Skorup and assigned to RCA Corporation. But, to achieve extremely high speed of operation it is preferrable to use dynamic counters. They normally have many less components and less delays per stage then static counters. Therefore, they can be operated at high speeds with less power being dissipated. Furthermore, in FIG. 1 the stage includes a first transmission gate (T1) for coupling signals to a master flip-flop and a second transmission gate (T2) for coupling signals from the master to the slave flip-flop. The two transmission gates are enabled at different times by means of turn-on and turn-off signals ($\phi$ and $\bar{\phi}$) which are derived from a clock signal. The Set (S) Reset (R) signals control the application of the turn-on and turn-off ($\phi$ and $\bar{\phi}$) signals to the transmission gates. When the set or the reset signal is present (high), the $\phi$ and $\bar{\phi}$ signals are held "High" and "Low", respectively, for the duration of the set or reset. Following the return of the set or reset to the "Low" condition, there is a delay before transitions in the $\phi$ and $\bar{\phi}$ signals can occur to turn the transmission gates on and off. This delay lowers the highest frequency at which the counter stage can be operated. Also, the set or reset signals do not necessarily terminate in synchronism with the leading or falling edge of the clock signal. Therefore, unless additional circuitry is provided, only a portion of a clock cycle may be available to transfer data from one portion of a stage or to another stage. Clearly, this may result in the incorrect transfer of data at high operating speeds.

Where the highest possible speed of operation is required, it is necessary to be able to reset (or set) the counters extremely quickly since this function may limit the speed of operation. It is also desirable to apply the reset (or set) signal for a well-defined period to ensure correct transfer of the desired information. Accordingly, counter circuits embodying the invention include means for resetting (or setting) the counter stage with very little delay and for fixed portions of a clock cycle.

Figure 2:
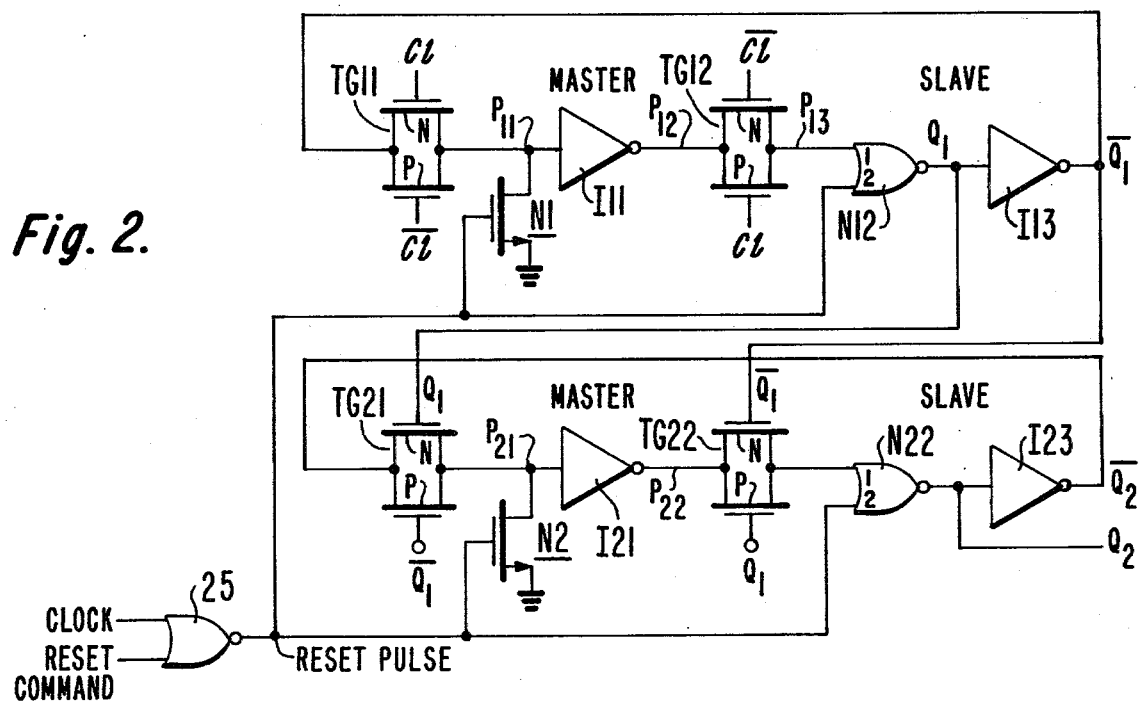
FIG. 2 is a schematic diagram of a resettable dynamic binary counter stage embodying the invention.

The circuit of FIG. 2 includes two dynamic binary counting stages of a ripple down counter. The two stages being identical in structure, only the first stage is described in detail. Each counting stage includes a master section and a slave section. The master section includes an inverter (I11) connected at its input to the stage input (P11). Also connected to the input of the stage is a resetting transistor (N1) whose source-drain (conduction) path is connected between the stage input and ground.

The slave section includes a two input NOR gate (N12) whose output (Q1), defined as the "true" output of the stage, is applied to the input of an inverter (I13) whose output ($\bar{Q_1}$) is defined as the "false" output of the stage. A feed-forward transmission gate (TG12) is connected between the output (P12) of the Master section and one (1) input of the NOR gate. When the feed-forward transmission gate (TG12) is turned on, the information at the output of the master is transferred to the input of the slave. A feedback transmission gate (TG11) is connected between the false output ($\bar{Q_1}$) of the stage and the input (P11) of the master. When the feedback transmission gate (TG11) is turned on, the output of the slave is transferred to the input of the master.

The transmission gates illustrated in the FIGURES include two insulated-gate field-effect transistors (IGFETs) of opposite conductivity type (N and P) having their conduction paths connected in parallel. Complementary signals are applied to their control electrodes for turning both transistors on or off concurrently. When turned on, or enabled, a complementary transistor transmission gate provides a very low impedance path (e.g. a closed switch) across its conduction paths. When turned off, or disabled, a complementary transmission gate provides a high impedance (e.g. an open switch) across its conduction path. Only one of the two transmission gates of each stage is turned on at any one time. In the circuit of FIG. 2, the externally applied clock signal (CL) and its inverse ($\overline{CL}$) are directly and continuously applied to the gate electrodes of the IGFETs forming the transmission gates of the first stage. This feature ensures that the transmission gates are always clocked and that there is no delay in turning them on and off. For the case of the square wave clock, shown in FIG. 3, TG11 is turned on and TG12 is turned off when CL is high (+V volts, true or logic "1"), and TG11 is turned off and TG12 is turned on when CL is low (0 volts, false, or logic "0"). Similarly in the second counter stage, TG21 is turned on and TG22 is turned off when $Q_1$ is high ($\bar{Q_1}$ is low), and TG21 is turned off and TG22 is turned on when $Q_1$ is low and $\bar{Q_1}$ is high. This assures that, when information is being transferred from the slave to the master, no information is transferred from master to slave and vice versa. The inverters and NOR gates described in the FIGURES may be formed with IGFETs of complementary conductivity type as shown in FIGS. 4A and 4B, where the IGFETs of N conductivity type are identified by the letter N and those of P conductivity by the letter P. These are shown by way of example only, and other circuits performing the same function could be used instead. It should also be understood that, although the transmission gates shown in the FIGURES are of complementary conductivity type, gates of single conductivity type could also be used.

The reset means for the counter stages includes a two input NOR gate 25 whose output is connected to the gates of the resetting transistors (N1, N2) and to the second input (2) of NOR gates N11 and N22. One input to NOR gate 25 is the input clock (CL) and the other input is a Reset Command.

The operation of the circuit of FIG. 2, in the counting mode, is known and need not be greatly detailed. As illustrated in the waveform diagrams of FIG. 3 whenever CL makes a transition from high to low, TG12 is enabled and the $Q_1$ and $\overline{Q_1}$ outputs of the first stage change state. Then, whenever CL goes positive TG11 is enabled and the input to the master of the first stage changes state. $Q_1$ and $\overline{Q_1}$ are complementary signals which vary at one half the rate of the clock signal. The outputs $Q_1$ and $\overline{Q_1}$, of the first stage control the turn-on and turn-off of the feedback and feedforward transmission gates in the second stage. The outputs $Q_2$ and $\overline{Q_2}$ of the second stage vary, in turn, at one half the rate of the $Q_1$, $\overline{Q_1}$ signals and bear a similar relationship to $Q_1$ and $\overline{Q_1}$ that the latter bear to the clock signals (CL, $\overline{CL}$).

Resetting of the circuit is detailed below. During reset, the feedback transmission gates (TG11, TG21) need to be turned off to prevent the flow of "fault" current from the output ($\overline{Q_1}$, $\overline{Q_2}$) of a stage through its reset transistor (N1 and N2). For example, if $\overline{Q_1}$ were at the high level and TG11 were turned-on when transistor N1 is turned on, "fault current" would flow from $\overline{Q_1}$ through TG11 and via the conduction path of transistor N1 to ground. The logic state at the input of the stage could then be indeterminate because the voltage level at P11 being a ratio of the impedance of the transmission gate transistors and transistor N1 might be high (+V) or low (ground) or intermediate these two levels.

Figure 3:
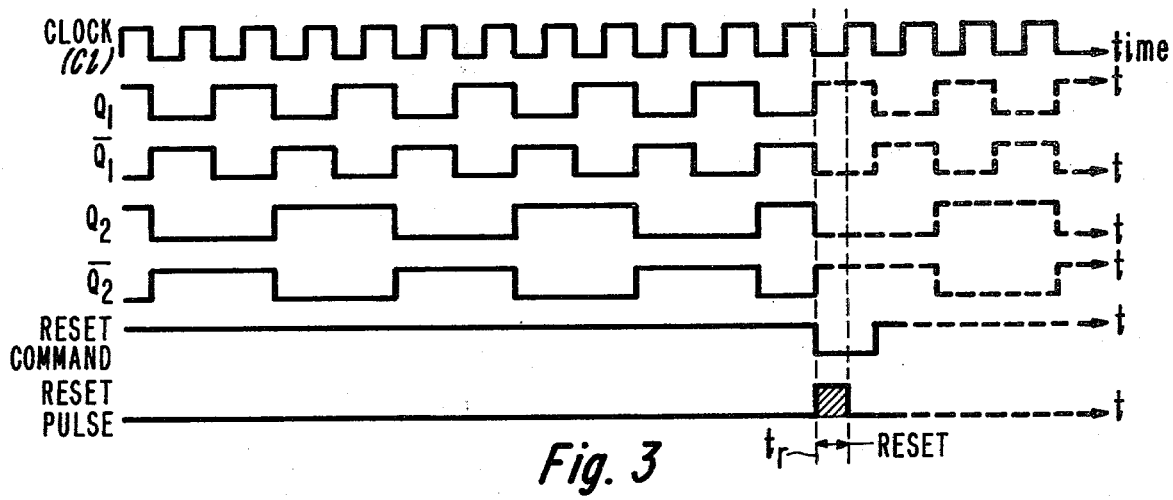
FIG. 3 is a diagram of waveforms associated with the circuit of FIG. 2.

In the circuit of FIG. 2, that problem is avoided by allowing a positive going reset pulse to be produced only when the feedback transmission gate TG11 is turned off (i.e. when the clock is low). This is achieved by NOR'ing the clock signal and the Reset Command via NOR gate 25. As illustrated in FIG. 3 at time $t=t_r$, when a Reset Command is present (i.e. the Reset Command is low) and the clock signal is low, a positive going Reset Pulse is produced at the output of NOR gate 25. Thus, during reset, no current can flow from, or to, $\overline{Q_1}$ via transmission gate TG11. This enables transistor N1, which is turned on by the Reset Pulse, to quickly clamp node P11 to ground potential.

Resetting the first stage sets $Q_1$ low via NOR gate N12 and $\overline{Q_1}$ high, and turns off TG21 to decouple the $\overline{Q_2}$ output of the second stage from its input. Thus, resetting the first stage automatically provides the correct condition (turning off feedback gate TG21) for easily resetting the following stage. Because of this feature it is only necessary in the operation of the first stage that a positive going Reset Pulse be applied to its reset transistor, N1, when the clock is low.

A feature of circuits embodying the invention is that the Reset Pulse is only generated for one half of the period of a clock cycle (assuming as shown herein, that the clock is a square wave). As shown in FIG. 3, the Reset Command can extend beyond one half of the clock period without causing the Reset Pulse to extend beyond half a cycle and without causing information to be transferred for less than a half-cycle period. Reset occurs during the designated one half of the clock cycle and the clock always controls. Since the clock signals (CL and $\overline{CL}$) are continuously applied to the control electrodes of the transmission gates in the first stage, there is no delay in the reapplication of the clock signals to the stage and no interruptions in the turn-on and turn-off of the transmission gates. Therefore, the speed of operation of the stage is optimized.

Another feature of the circuit of FIG. 2 is that the master and slave sections are reset in parallel by applying the Reset Pulse to the gates of the resetting transistors (N1, N2) and to the second input (2) of NOR gates N12, N22 in each stage.

Note that the slave need not be reset independently of the master, since when the Reset Pulse is present and the master is reset, the slave will automatically be reset to the condition $Q_1$ - low and $\overline{Q_1}$ - high via TG12. However, there is a propagation delay between the time the master is reset and the time its output is applied via gate TG12 to the input of the slave. Hence, for the highest speed of operation a NOR gate 12 is employed so that the Reset Pulse can be directly applied to the slave.

However, as discussed below, conditions exist when, the outputs $Q_1$ and $\overline{Q_1}$ of the resettable counter stage used as part of a counter, are already in the desired state of $Q_1$ - low and $\overline{Q_1}$ - high when the counter stage is to be reset. It is then not necessary to reset the slave, as shown in FIG. 5.

FIG. 5 shows a divide-by-N counter whose first stage is a partial resettable dynamic counter stage, so called because only the master section is reset, the slave section being set to the desired condition when the master is reset, as described below. This enables extremely high speed of operation since there is almost no delay.

The first counting stage of FIG. 5 differs from the counting stages of FIG. 2 in that the input stage of the slave section is an inverter I12 instead of a NOR gate. Also, in FIG. 5, the circuitry to reset the first stage includes 3 transistors (N11, N21, N31) having their conduction paths connected in series between the input P11 and ground. The $\overline{CL}$ signal is applied to the gate of transistor N11, the decoded output of the counting stages is applied via TG30 to the gate of transistor N21 and a Reset Enable signal is applied to the gate of transistor N31. These three transistors N11, N21, N31 perform an AND type function causing the first stage to be reset when the stages of the counter are in a predetermined state. The true and false outputs ($Q_1$, $\overline{Q_1}$) of the first stage are applied to the subsequent stage of the divide-by-N counter which is represented by block 35. The counter is a ripple down counter (i.e., the output(s) of a stage are used as the clocking signals to the next subsequent stage) whose stages are interconnected to count down. These types of circuits are well known in the art and will not be detailed. A preset counting means 37 connected to the divide-by-N counter enables the presetting of the stages of the counter to any desired count by jamming a preselected count into the counter. The presetting circuitry may be any one of a known number of circuits or switches used to preset counters. Following the presetting of the counter, the clock signals are applied to the counter. Assume, as shown in FIG. 6, that $Q_1$ and $\overline{Q_1}$ change stage when CL goes negative and that likewise the K-1 stages of counter 35 change state when their unprimed clocking input(s) make(s) a negative going transition. The divide-by-N counter counts down until all its true outputs ($Q_1 \ldots Q_k$) are driven to the logic "0" level. When this occurs all the "false" outputs ($\overline{Q_1} \ldots \overline{Q_k}$) of the counter are at the logic "one" level. The "false" outputs are applied to a decoder which includes AND gate A30 whose output (X) is coupled via transmission gate TG30 to the gate electrode (Y) of transistor N21. When $\overline{Q_1}$ through $\overline{Q_k}$ are at the "high" level the output of A30 goes high.

The discussion to follow is best understood with reference to FIG. 6. Assume that at time T1: (1) CL goes low ($\overline{CL}$ - high), $Q_1$ goes low, and $\overline{Q_1}$ goes high; and (2) $\overline{Q_2}$ through $\overline{Q_k}$ go (or are) high. With $\overline{Q_1}$ through $\overline{Q_k}$ low the output X of AND gate A30 goes high.

At time T2, CL goes high ($\overline{CL}$ - low) and TG30 is turned on, coupling the high output of A30 to the gate electrode (Y) of transistor N21. This high output is of a polarity and magnitude to turn transistor N21 full on.

At time T3, CL goes low turning off TG30; but, Y remains charged to the high level and transistor N21 is still full on. $\overline{CL}$ goes high turning transistor N11 full on. Assuming that the signal to the gate electrode of transistor N31 is also high, node P11, which went high, is clamped to ground via the conduction paths of transistors N11, N21, and N31. With CL - low and $\overline{CL}$ - high TG11 is turned off and node P11 is easily clamped to ground. TG12 is turned-on and the low at P11 would cause $Q_1$ and $\overline{Q_1}$ to go low and high, respectively. But, $Q_1$ and $\overline{Q_1}$ are already at these desired levels. Thus, only the master section of the first stage has been reset while the slave section has been maintained in the condition to which it was already set. This is termed partial reset and its importance is further discussed below.

For high speed programmable divide-by-N counting, partial resettable counters are applicable. In this technique, a count is jammed (i.e. stages 2 through K are preset to some value between the all "0" and all "1" condition) into the divide-by-N counter and the counter is counted down to zero. The speed at which divide-by-N counting is possible depends largely on the speed of the first stage. All other stages of the counter may be reset and may count at a lower rate. A dynamic partial resettable counter is ideal for this application.

In jamming the count into the first stage of a dynamic divide-by-N counter chain, advantage may be taken of the following facts:

1. Jamming is to be done on the clock pulse following the condition that all counter stages have counted down to zero. (The first stage is the last to achieve this condition.) Thus, delay of the first stage is the critical delay.

2. Since the first stage will automatically change from a zero to a one on the following clock period, no action is required to jam a one. Only jamming a zero requires action.

3. Jamming a zero into the first stage is simplified because it is known that the previous state was a zero. Thus, only the master stage requires resetting to hold the zero that was previously in the slave stage. Therefore, only partial resetting is required.

In the circuits of FIGS. 2 and 5 the counter stages have been reset by means of one or more reset transistors connected between the input of a counting stage and ground. It should be appreciated that each stage could also be set or reset by means of one or more transistors, (e.g. of P conductivity type) connected between the input of the stage and the most positive operating potential (+V volts) applied to the counter stages. This would set the input to a "1" rather than a "0".

The term reset as used herein refers to setting the false output ($\overline{Q}$) to logic 1, "high", or true level; and setting the true output (Q) to the logic zero, low or false level. However, this could equally be defined as setting the counter stage rather than resetting the counter stage.

What is claimed is:

1. A counter stage in combination with a source of cyclical signals having a first binary significance during a first portion of the cycle and having a second binary significance during a second portion of the cycle, comprising:

a first section and a second section, one of said first and second sections having an input and an output at which is produced a signal 180° out-of-phase with a signal at its input, and the other one of said first and second sections having an input and an output at which is produced a signal in-phase with a signal at its input;

a first transmission gate connected between the output of the first section and the input to the second section for, when enabled, coupling the output of the first section to the input of the second section;

a second transmission gate connected between the output of the second section and the input of the first section for, when enabled, coupling the output of the second section to the input of the first section;

resetting means coupled to the input of the first section for, when enabled, setting the input of the first section to a predetermined level;

means for continuously applying said cyclical signals to said first and second transmission gates for enabling said first transmission gate and disabling said second transmission gate during said first portion of each cycle, and for enabling said second transmission gate and disabling said first transmission gate during said second portion of each cycle;

a terminal adapted to receive a reset signal; and gating means responsive to said cyclical signals and to said reset signal for enabling said resetting means only during said first portion of each cycle and when a reset signal is present.

2. The combination as claimed in claim 1 wherein said resetting means includes a transistor having a conduction path and a control electrode and wherein its conduction path is connected between the input of said first section and a point of fixed reference potential; and wherein said gating means responsive to said clock signal and to said reset signal includes a first logic gate having at least two inputs and one output and wherein said cyclical signal is applied to one of its inputs and said reset signal is applied to another one of its inputs and wherein its output is connected to the control electrode of said transistor of said resetting means.

3. The combination as claimed in claim 2 wherein said second section includes a second logic gate having two inputs and one output, wherein one of its two inputs is connected to the input of said second section and wherein the other one of its two inputs is connected to the output of said first logic gate.

4. The combination as claimed in claim 3 wherein said second section also includes an inverting stage having an input connected to the output of said second logic gate and having an output connected to the output of said second section; and wherein said first section includes an inverting stage having an input connected to the input of said first section and its output connected to the output of said first section.

5. A high speed counter comprising:
a source of cyclical input signals to be counted, said input signals having a first and a second portion per cycle;
a resettable counter stage for counting said input signals and producing output signals responsive to said input signals including: (a) a master section and a slave section; (b) a first transmission gate connected between the output of the master section and the input to the slave section; (c) a second transmission gate connected between the output of the slave section and the input of the master section; and (d) means applying said input signals to said first and second transmission gates for enabling said first transmission gate and disabling said second transmission gate during said first portion and for enabling said second transmission gate and disabling said first transmission gate during said second portion of each input signal cycle;
K-1 cascaded counter stages for counting, when enabled, the output signals of said resettable stage where K is an integer greater than 1; and
resetting means coupled to the input of said master section responsive to a predetermined state of said K-1 counter stages and of said resettable stage, and to said input signal being in said first portion of its cycle for resetting the master section of said first stage while said second transmission gate is disabled.

6. The combination as claimed in claim 5 wherein said master section has an input and an output at which is produced a signal 180° out-of-phase with the signal at its input, and wherein said slave section has an input and an output at which is produced a signal in-phase with the signal at its input.

7. The combination as claimed in claim 6 wherein said resetting means includes at least first and second transistors having their conduction paths connected in series between said input of said master section and a point of reference potential;
wherein a signal is applied to the control electrode of the first transistor for turning it on only when said second transmission gate is disabled; and
wherein a signal is applied to the control electrode of the second transistor for turning it on when said resettable counter stage and K-1 cascaded stages are in said predetermined state.

8. The combination as claimed in claim 7 wherein said K-1 cascaded counter stages form a count-down ripple-down binary counter; and
further including means coupled to the K-1 counter stages for setting a selected count into said counter.

9. The combination as claimed in claim 8 wherein said means responsive to a predetermined state of said K-1 counter stages and said resettable counter stage includes decoding means coupled to said K-1 counter stages and to said first stage for sensing said predetermined state, and, in response thereto, producing an output signal which is selectively applied to the control electrode of the second transistor of said resetting means.

10. A high speed counter comprising:
a source of cyclical input signals to be counted, said input signals having a first and a second portion per cycle;
a resettable counter stage for counting said input signals and producing output signals responsive to said input signals including:
(a) first and second sections, each section having an input and an output; one of said first and second sections having an output at which is produced a signal 180° out-of-phase with a signal applied to its input, and the other one of said first and second sections having an output at which is produced a signal in-phase with a signal applied to its input; and
(b) means responsive to said cyclical input signals for coupling said output of said first stage to said input of said second stage and decoupling the output of said second stage from the input of said first stage during said first portion of each cycle and for coupling said output of said second stage to said input of said first stage and decoupling the output of said first stage from the input of said second stage during said second portion of each cycle;
K-1 cascaded counter stages for counting, when enabled, the output signals of said resettable stage where K is an integer greater than 1; and
resetting means coupled to the input of said first section, responsive to a predetermined state of said K-1 counter stages and of said resettable stage, and to said input signal being in said first portion of its cycle for resetting said first section of said first stage while said output of said second stage is decoupled from said input of said first stage and while said second section is already in the state in which it would be placed by the transfer of the output of the first section to the input of the second section.

* * * * *